US006678583B2

(12) United States Patent
Nasr et al.

(10) Patent No.: US 6,678,583 B2
(45) Date of Patent: Jan. 13, 2004

(54) ROBOTIC STORAGE BUFFER SYSTEM FOR SUBSTRATE CARRIER PODS

(75) Inventors: Amro Nasr, Stevenson Ranch, CA (US); Samer Kabbani, Pasadena, CA (US)

(73) Assignee: SemiNet, Inc., Valencia, CA (US)

( * ) Notice: Subject to any disclaimer, the term of this patent is extended or adjusted under 35 U.S.C. 154(b) by 1 day.

(21) Appl. No.: 10/211,184

(22) Filed: Aug. 2, 2002

(65) Prior Publication Data

US 2003/0040841 A1 Feb. 27, 2003

Related U.S. Application Data

(60) Provisional application No. 60/397,389, filed on Jul. 17, 2002, and provisional application No. 60/310,558, filed on Aug. 6, 2001.

(51) Int. Cl.[7] .............................................. G06F 19/00
(52) U.S. Cl. ...................... 700/245; 700/254; 700/264; 700/229; 414/200; 414/201; 414/217; 414/277; 206/710; 206/711; 318/568.1
(58) Field of Search ................................ 700/245, 254, 700/264, 229; 318/568.1; 414/217, 277, 200, 201; 206/710, 711

(56) References Cited

U.S. PATENT DOCUMENTS

2002/0009457 A1 * 1/2002 Parkinson et al. .......... 701/215
2002/0068992 A1 * 6/2002 Hine et al. .................. 700/229
2003/0091409 A1 * 5/2003 Danna et al. ............... 414/217
2003/0113190 A1 * 6/2003 Bachrach .................... 414/217

OTHER PUBLICATIONS

Brain et al., Emerging needs for continuous flow FOUP transport, 1999, IEEE, pp. 76–82.*

European Semiconductor, Moving beyong robot tteaching, 2003, pp. 1–2.*

* cited by examiner

Primary Examiner—Yonel Beaulieu
Assistant Examiner—McDieunel Marc
(74) Attorney, Agent, or Firm—Michael W. Landry

(57) ABSTRACT

A storage/buffering system for the stocking and/or buffering of substrate and/or substrate carriers in a process environment includes a 6-axis robot. An end-effector is connected with the robot providing an additional one degree of freedom and a mechanism for grabbing and moving of substrate and/or substrate carriers. The robot is mounted in an inverted orientation to a removable service cart for easy removal of the robot to a service area in the event of breakdown. The robot receives commands from a programmable controller connected to control the robot and configured to direct the arm of the robot through a set of movements. Product is loaded in and out of the system through I/O load ports. Product is stored inside the storage/buffering system on a plurality of storage locations, each with product presence/absence detect sensor.

8 Claims, 16 Drawing Sheets

ROBOTIC STORAGE BUFFER SYSTEM FOR SUBSTRATE CARRIER PODS

RELATED APPLICATIONS

This application claims the benefit of U.S. provisional patent application No. 60/397,389 filed Jul. 17, 2002 entitled: Robotic Storage Buffer System for Substrate Carrier Pods; and United States provisional patent application No. 60/310,558 filed Aug. 6, 2001 entitled: Robotic Storage Buffer System for Substrate Carrier Pods or the Like.

TECHNICAL FIELD

The present invention relates to devices and methods for the stocking/buffering of substrate and substrate carriers and particularly to stocking/buffering using a robot arm.

BACKGROUND OF THE INVENTION

A semiconductor fabrication line performs various processing steps to wafer substrates to produce integrated circuits. Present fab systems use reticle or full wafer masks which are stored in standard mechanical interface (SMIF) pods, front opening unified pods (FOUPs), or stocked as bare masks. Wafer sizes vary depending on the semiconductor process; typical maximum sizes are 200 mm and 300 mm in diameter. Wafers can be stored in SMIF pods or FOUPs, which hold as many as 25 substrates.

Intermediate term stocking and short term buffering of substrate carriers is needed to supply the articles to the manufacturing steps as needed. To address the high throughput demands of many manufacturing environments a stocking/buffering system is needed to store carriers in quantity and transfer it via an automated method. The system is either placed in a stand-alone mode where its purpose is to feed material to the Fab itself or in a local mode where it feeds a local tool or tool cluster.

Presently, the main design technique in building these systems automation components is the use of Cartesian slide systems configured in such a way as to achieve the desired motion profile through a plurality of degrees of freedom, usually 3 or 4. The automation components are a combination of linear positioning stages and other motion systems.

One of the major problems of this method has been the automation component itself. Usually being an aggregation of several linear slides, the reliability and serviceability of such systems have been consistently poor. Linear slide systems are subject to alignment problems, which can cause binding and malfunction resulting in a low mean-time-between-failure performance. Also since this is not a true unified automated solution, the design, assembly, and programming time is greatly increased.

Another method of automation utilized is a selective or single compliant assembly robot arm (SCARA) robot mounted on an extra vertical axis of motion to achieve a specific Z height. Although this method is much more reliable than the Cartesian system, the SCARA robot needs a very large footprint to negotiate the product through. This in many cases, results in a system that is unacceptable in size to end users where applications are space critical.

The prior art stocking systems do not have the capability of selecting a carrier from a stocking area and transferring it directly to front end automation with multiple load ports.

A need exists for a method and apparatus for stocking substrate carriers that is small in footprint, highly reliable, and easy to service.

SUMMARY OF THE INVENTION

A new robotic storage system utilizes an invert mounted 6-axis articulated robot arm to transport objects such as FOUPs or SMIF pods between a storage location and an I/O load port. A seventh degree of freedom is provided by an end-effector to accomplish motion within a small space. FOUPs and SMIF pods are stored in a high density arrangement on shelves within a storage area. Each storage location within the storage area has a presence/absence detection sensor.

The present system provides in a storage buffer system the ability to stock and randomly access a large number of substrate carrier pods, or other containers, fixtures, parts, or assemblies used in an automated production process. The system uses a minimal footprint while providing a simple and reliable design that has a low repair time.

Suspending an invert mounted robot from the top of the enclosure provides clearance for the robot to function without obstruction. Floor area is therefore available for other system components and additional area for stored items. A FOUP or SMIF pod cleaner is one example of a process that can be incorporated into the system using this area. Additionally, this configuration provides improved access to the robot for maintenance or replacement.

The seventh axis on the robot, using a swiveling end-effector, allows the robot to capture material at all locations effectively, thus making accessible locations that would otherwise be inaccessible without the additional axis.

The seventh axis can be implemented with a passive or active control. A passive system uses an upper dowel and bearing to permit the pod holder to swing freely, relying on gravity to maintain an upright orientation. An active system uses electrical, pneumatic, or hydraulic mechanisms to maintain the end-effector in the desired orientation.

An automatic teaching capability uses proximity sensors, angle encoders on the robot axes, and torque feedback from the robot motors to allow the robot system to sense locations and obstructions and thereby define the location of features in the storage system and the optimum trajectory for movement between points.

The storage system is suitable for intermediate term stocking and short term buffering of articles. The stored articles can be substrate carriers, for example front opening unified pods (FOUPs), standard mechanical interface (SMIF) pods, or substrates without carriers.

A removable service cart provides access to the interior regions of the system to expedite servicing the system and it subassemblies.

The device comprises a robot including an arm movable in a plurality of degrees of freedom, the arm having a free end. An end effector is connected the robot and has a clasping end mounted to the arm proximal to the free end so as to be positionable by the robot. The robot positions the clasping end of the end effector with respect to the substrate or substrate carrier as to properly position the end effector for pick up of object. The end effector has one degree of freedom to allow greater flexibility for the robot to access storage locations. The robot is mounted inverted to facilitate greater mobility in a small confine without the robot structure interfering with access of storage locations.

The present invention uses a method of stocking/buffering substrate and substrate carriers comprising the following steps:

providing a robot having an arm movable in a plurality of degrees of freedom and an end effector connected with the robot;

automatically moving the arm to align the end effector to pick up or place material in and out of buffer system.

A buffer system constructed and operated in accordance with the present invention enables a system that is completely automatic in operation, has a minimized footprint, operates reliably, and has a rapid repair time.

The buffer system is capable of handling the FOUP or SMIF pods and transferring directly to the process equipment for loading and unloading.

DETAILED DESCRIPTION OF THE INVENTION

Figure 1:
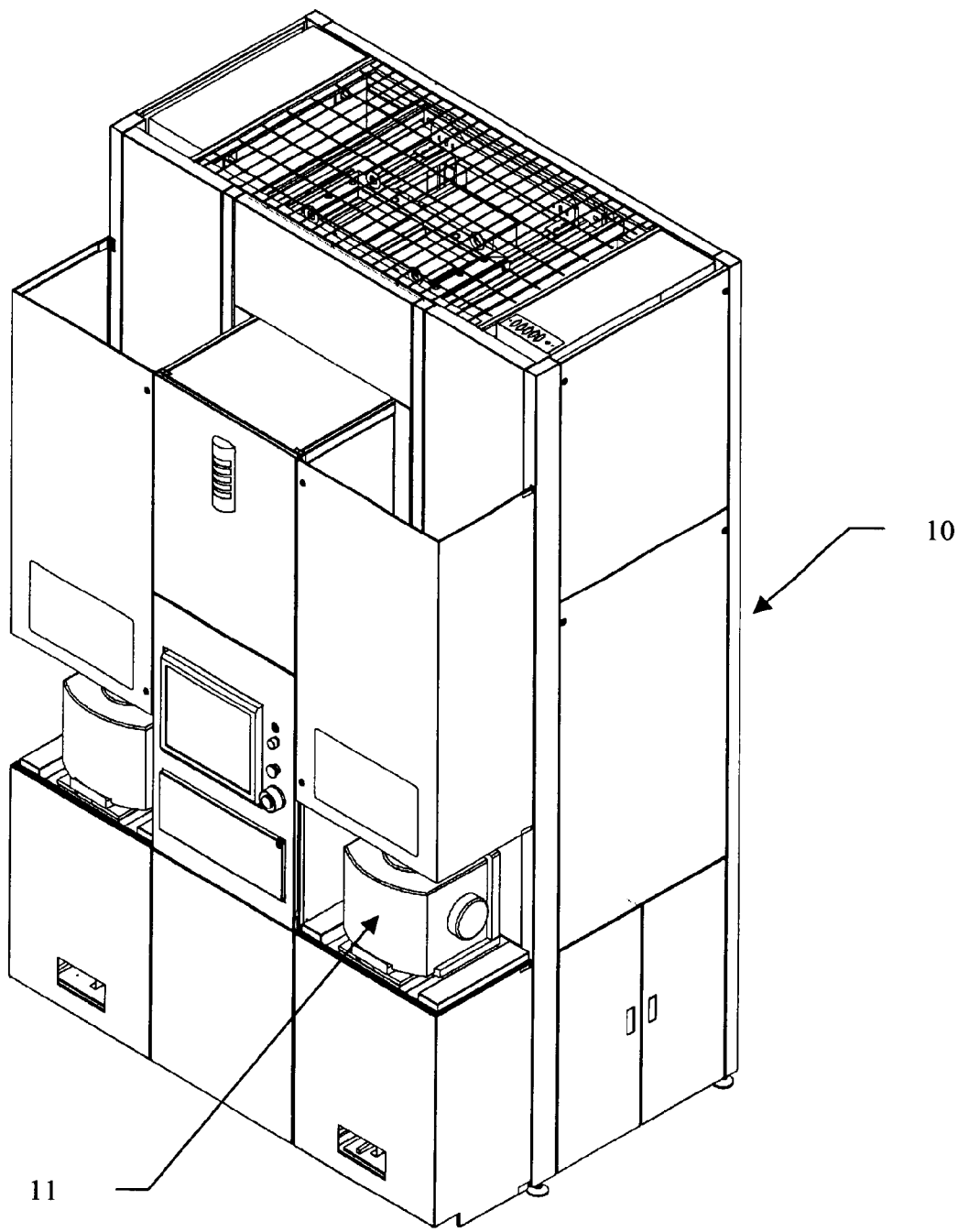
FIG. 1 is an isometric view of the robotic stocking/buffering system in accordance with the present invention.
Figure 2:
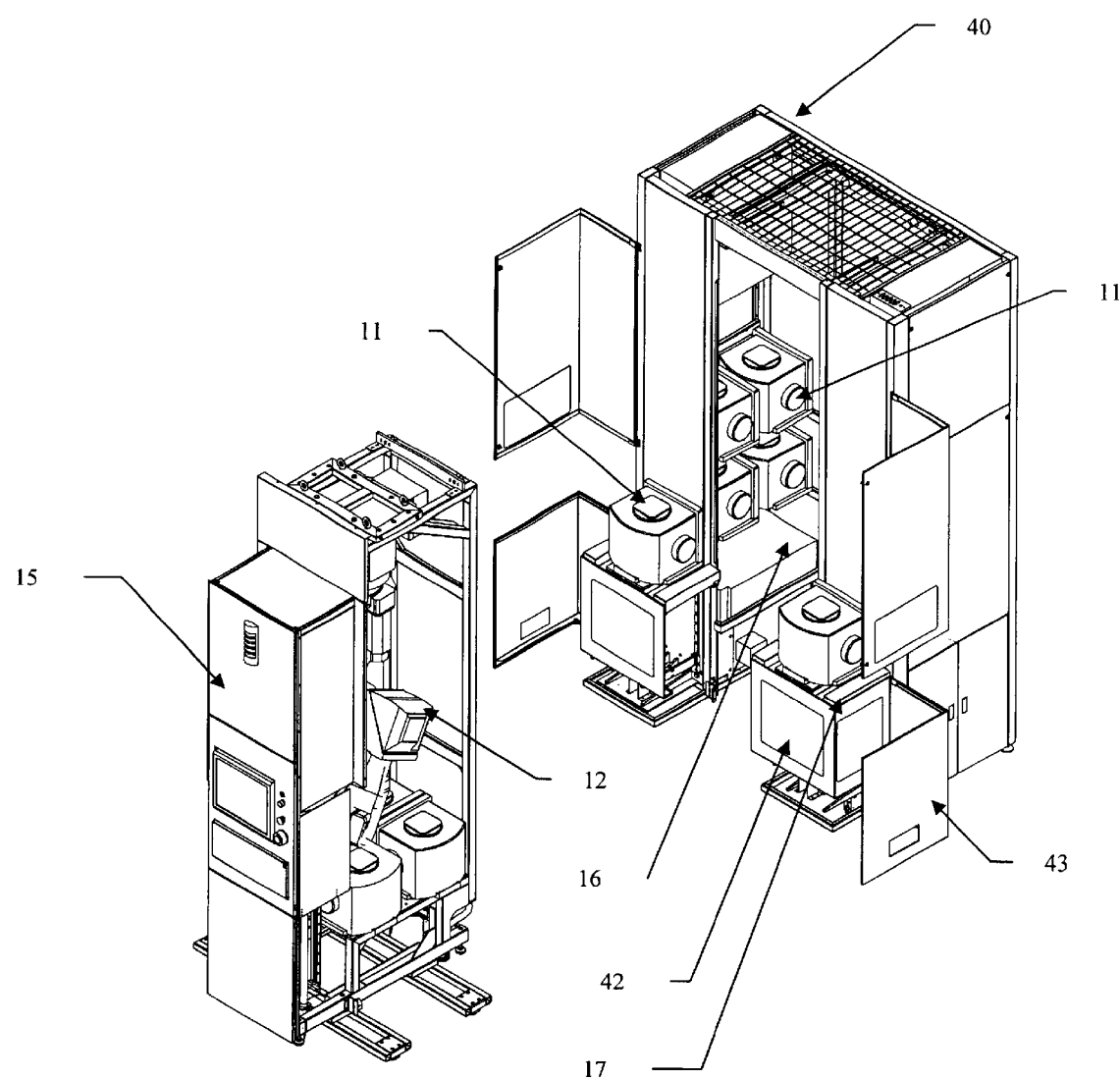
FIG. 2 is an exploded view of the robotic stocking/buffer system with the robot cart assembly detached from the main system.

FIG. 1 shows an embodiment of a robotic stocking/buffering 10 for the stocking and/or buffering of substrates and/or substrate carriers 11. FIG. 2 is an exploded view of the robotic stocking/buffer system with the removable service cart assembly 15 detached from the storage enclosure 40. Robot 12 is used for transporting stored items within the storage system 10. Robot controller 16 is shown, which commands the operation of robot 12. Sliding doors 42 function as a safety shield to prevent operator injury when robot 12 accesses objects in I/O port 17. Door 43 provides access for servicing.

Figure 3:
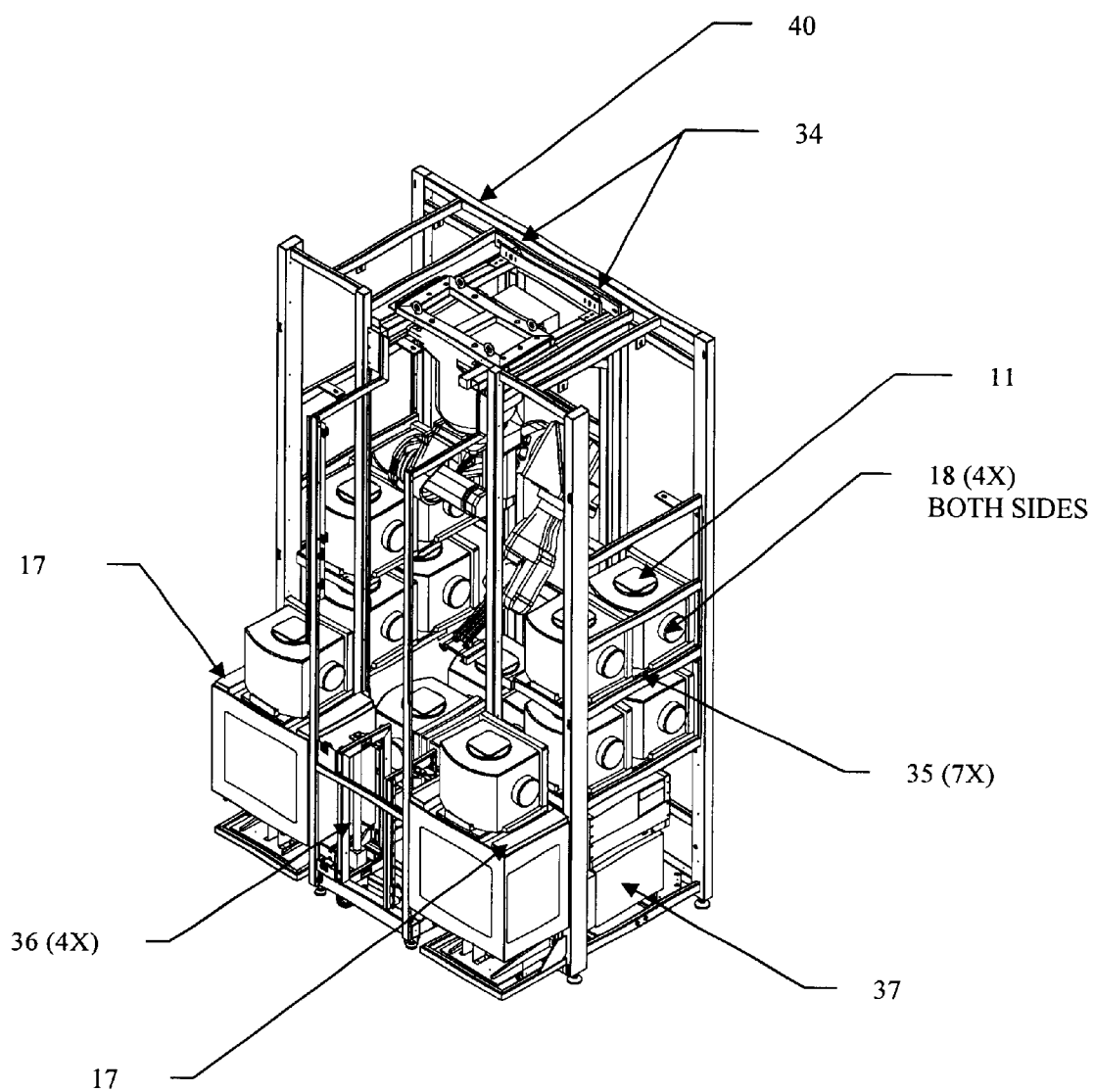
FIG. 3 is a detailed isometric view of the system with covers and doors removed.

Referring to FIG. 3, an interior view of storage enclosure 40 with removable cart 15 engaged, substrate carriers 11 are positioned in storage locations 18. Substrate carriers 11 rest on shelves 35, which are adapted to hold specific items. Kinematic couplings 34 define the installed position of removable service robot cart 15 allowing repeatability in position when removal and replacement occur. Bolts secure the service cart 15 to the storage enclosure 40. Pneumatic actuators 36 cause sliding doors 42 to slide open to place objects in I/O load ports 17. Sliding doors 42 slide to a closed position before robot 12 attaches to the object. Magnetic sensors indicate the limits of travel of pneumatic actuator 36 and sliding doors 42.

Figure 4:
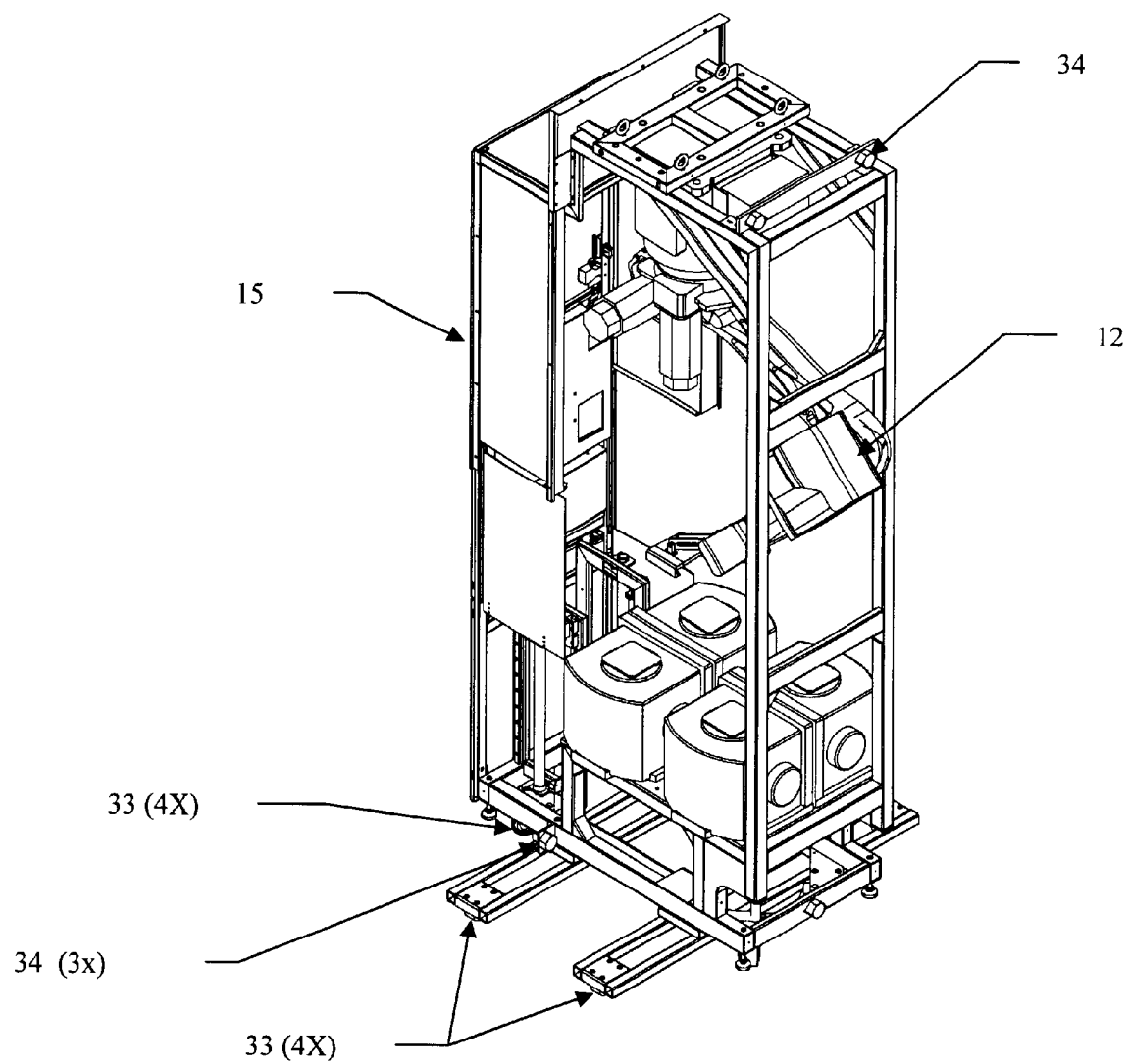
FIG. 4 is an isometric view of the removable robot cart assembly.

Referring to FIG. 4, the removable service cart 15 is a structure that is a separable from the storage enclosure. Robot 12 is mounted to a section of the cart frame. The removable service cart 15 is supported on a plurality of casters 33 so that the cart can be rolled to a service bay in the event of failure. In the event of removal and reinstallation, accurate alignment is critical to avoid re-teaching the robot point locations. Therefore, a plurality of kinematic couplings 34 located at the top and bottom of the cart frame that mate with couplings in the storage enclosure are used for accurate relocation.

Figure 5:
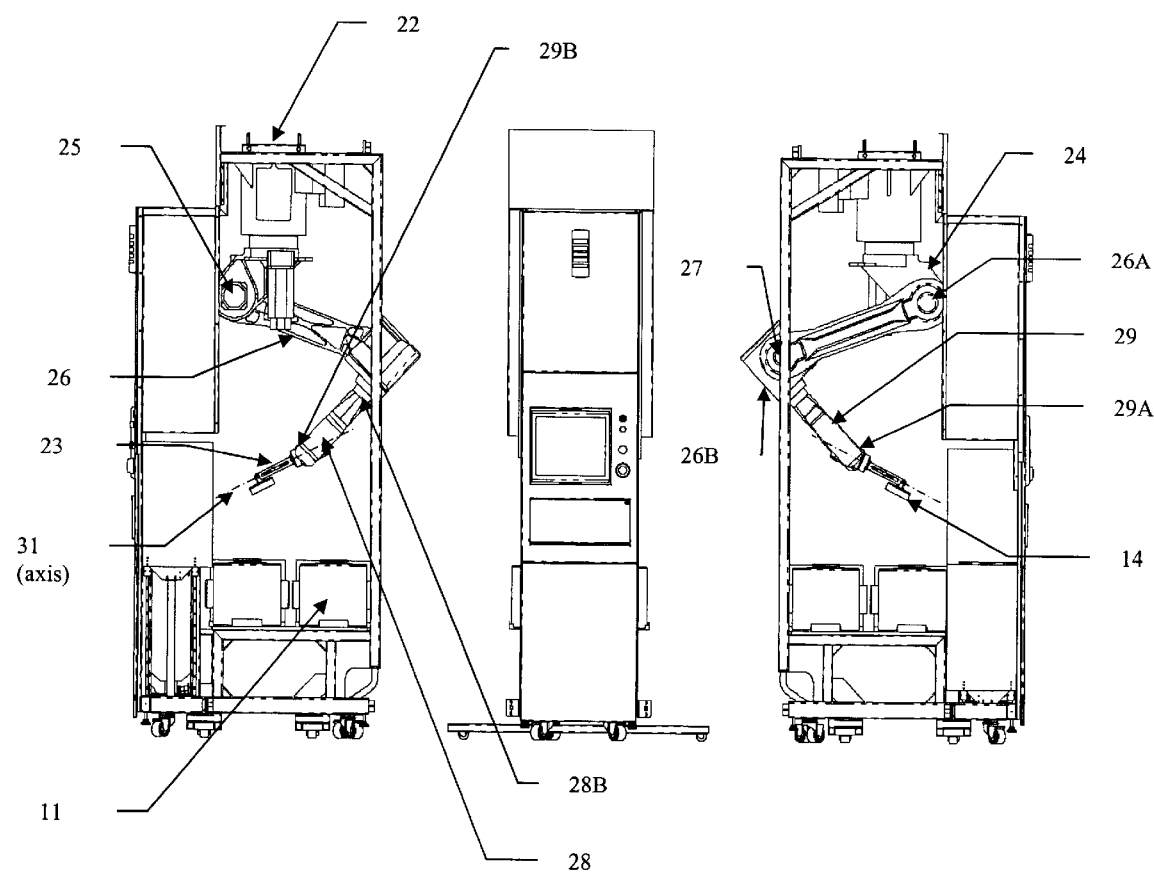
FIG. 5 is a side and front view of the removable robot cart assembly.

FIG. 5 show side views of removable service cart 15.

Storage enclosure 40 and removable service cart 15 are constructed from welded stainless steel tubing.

Figure 6:
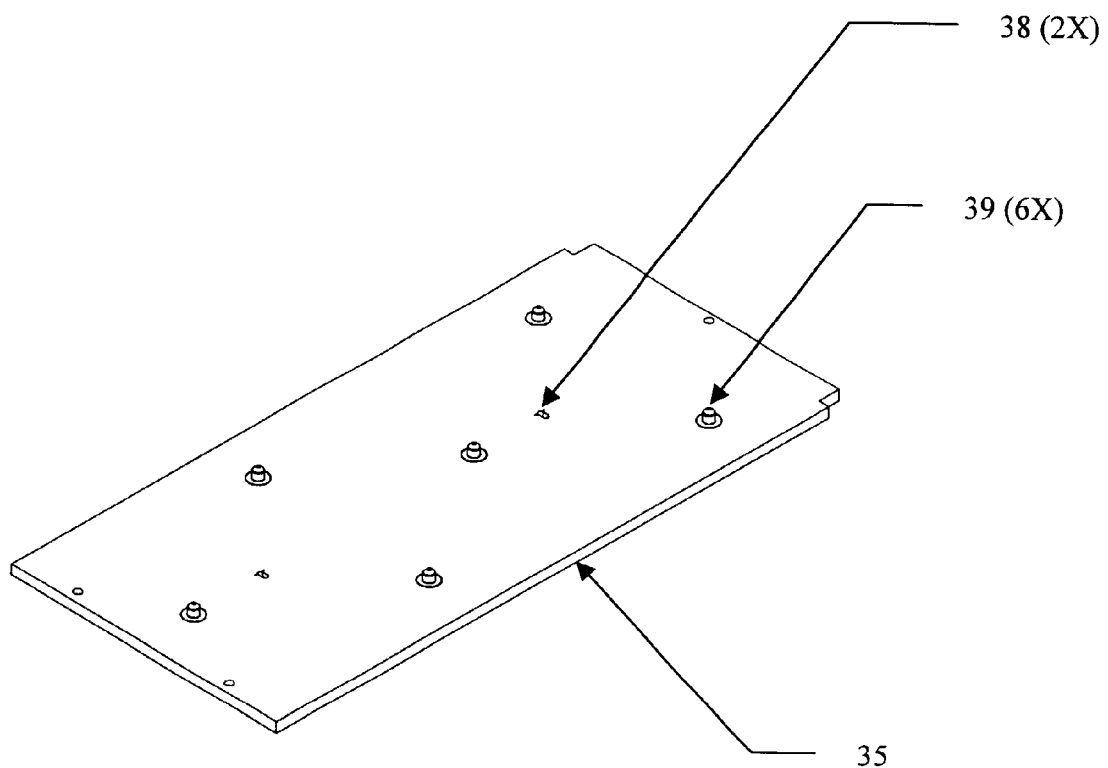
FIG. 6 is a detailed view of a shelf suitable for storing substrate carriers inside the robotic stocking/buffer system.

FIG. 6 shows a detailed view of a shelf suitable for holding FOUPS. Kinematic pins 39 hold the FOUP in a predetermined position. Sensors 38 indicate the presence or absence of an item on the shelf. The sensors can be reflective, micro switch, Hall Effect, or any other sensor that responds to the presence of an item. The sensor signal is an input to control software that directs robot movement and maintains an inventory of stored carriers and available storage locations. The sensors also provide confirmation of a placement or removal operation of a carrier from a storage location by the robot. FIG. 6 shows a dual FOUP Shelf; other shelves can be adapted to hold varying numbers of FOUPs or other stored objects.

Figure 8:
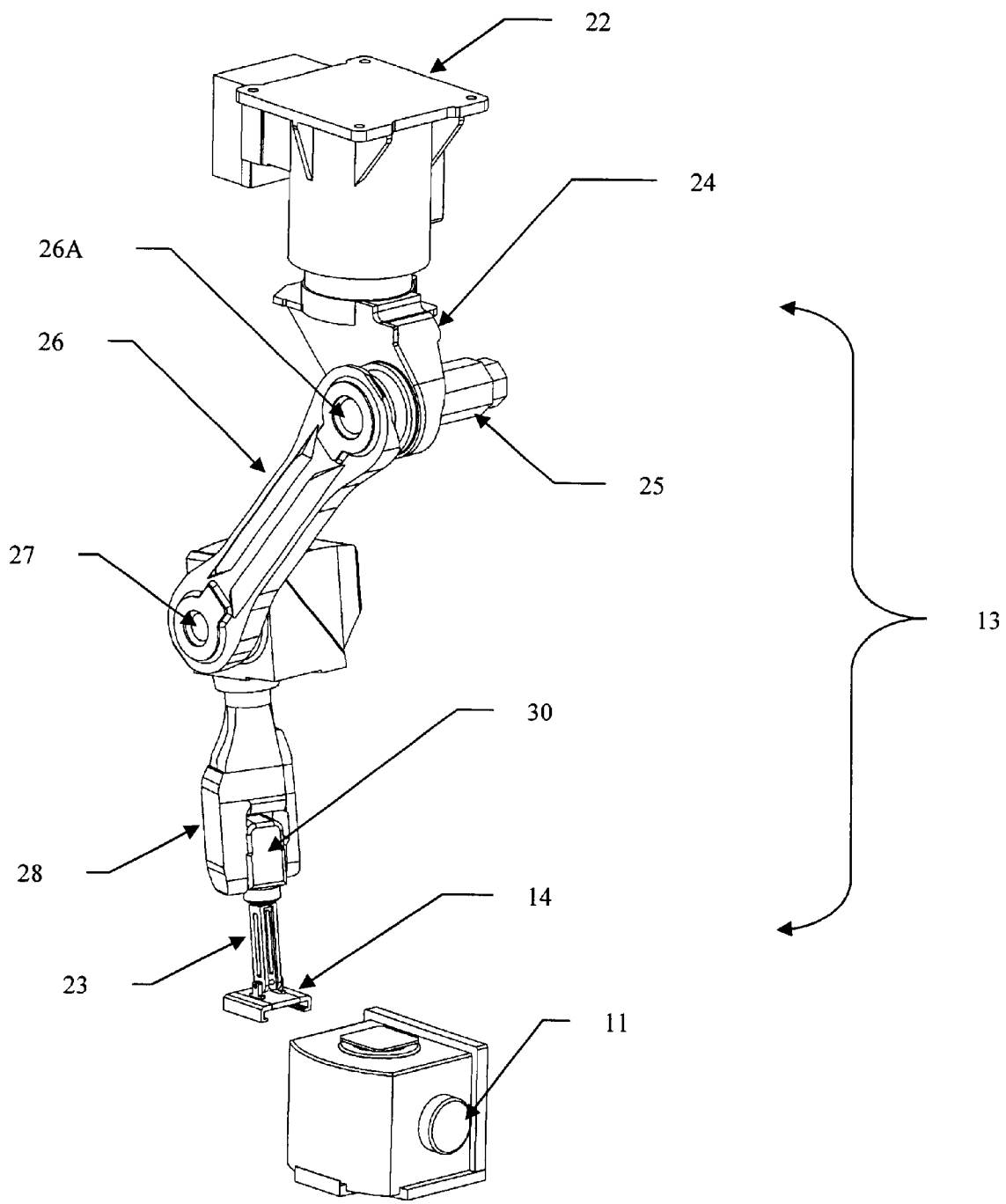
FIGS. 8–12 show a series of images demonstrating a capture sequence to a substrate carrier for a passive end effector version.
Figure 9:
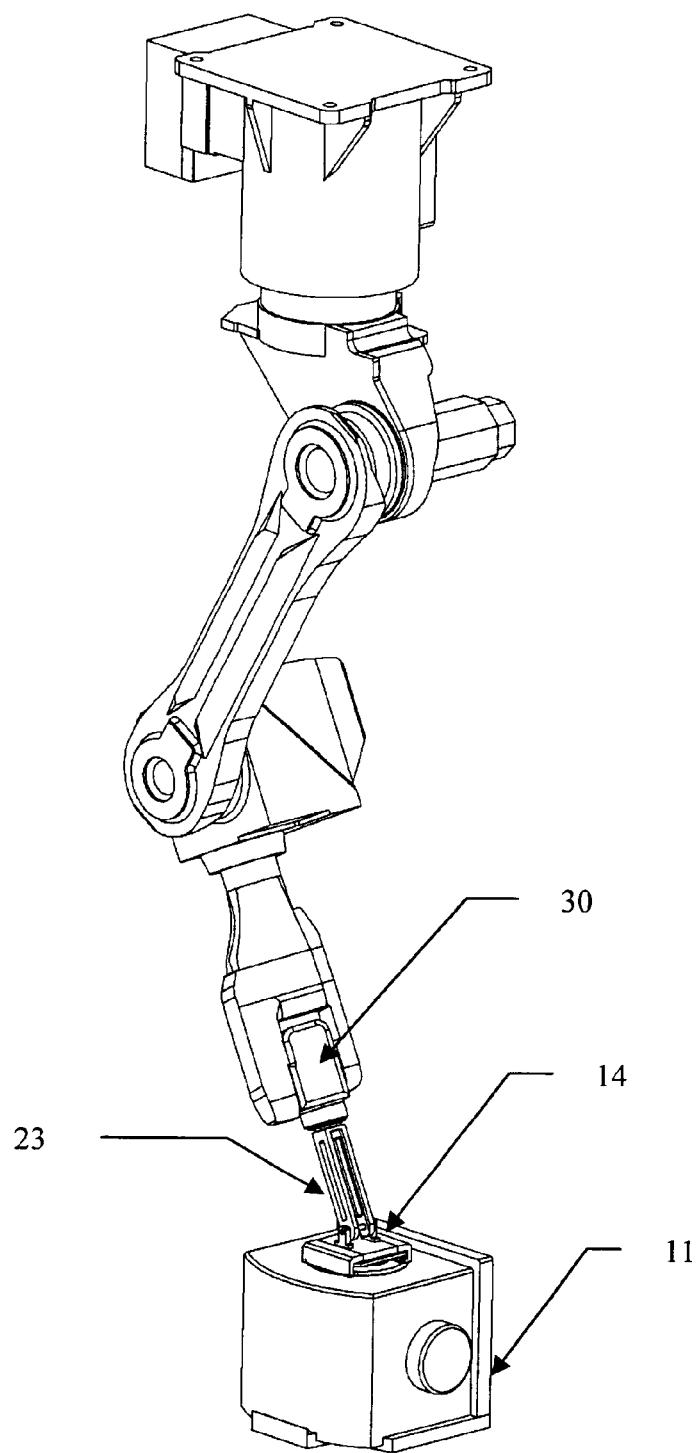
Figure 10:
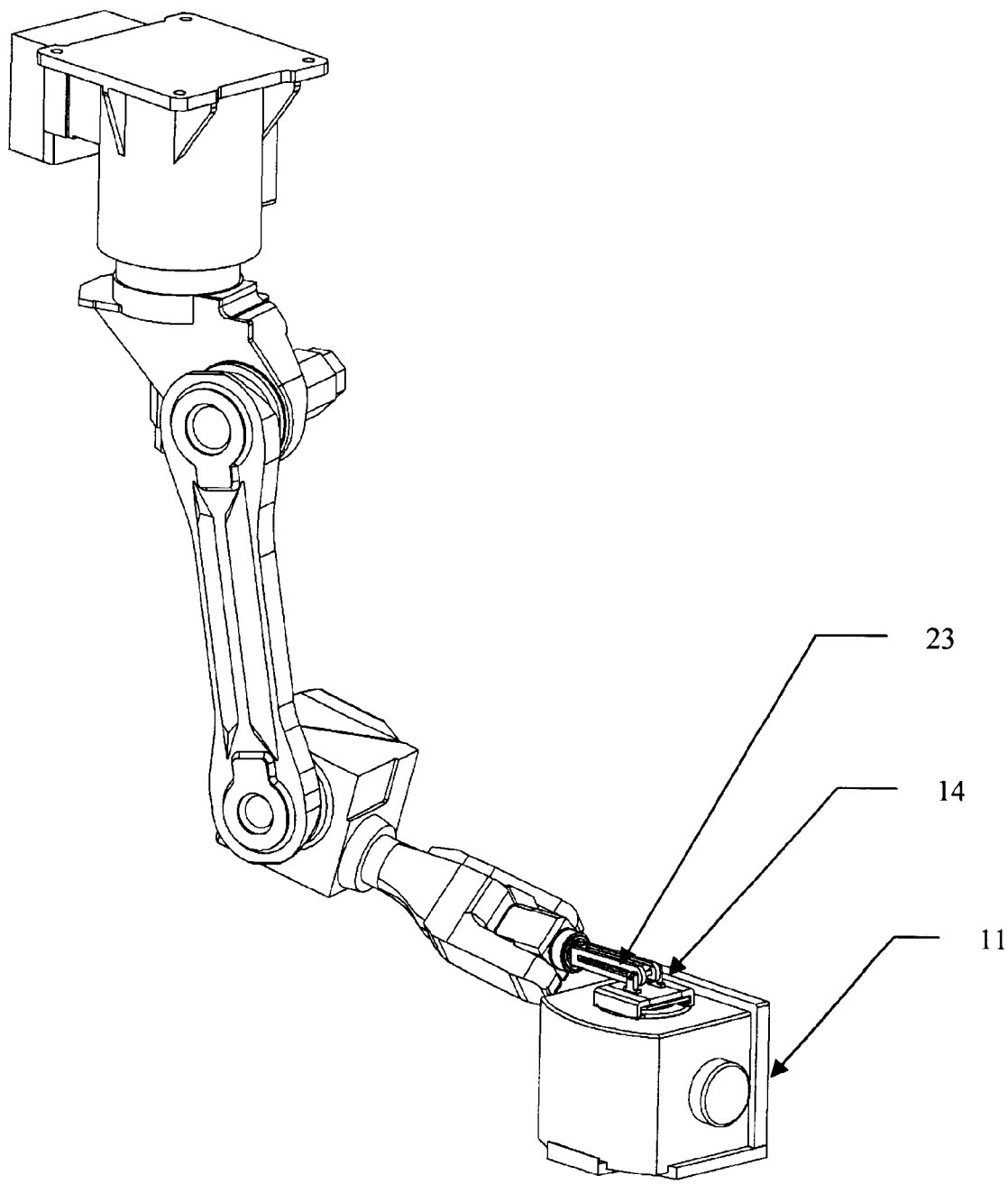
Figure 11:
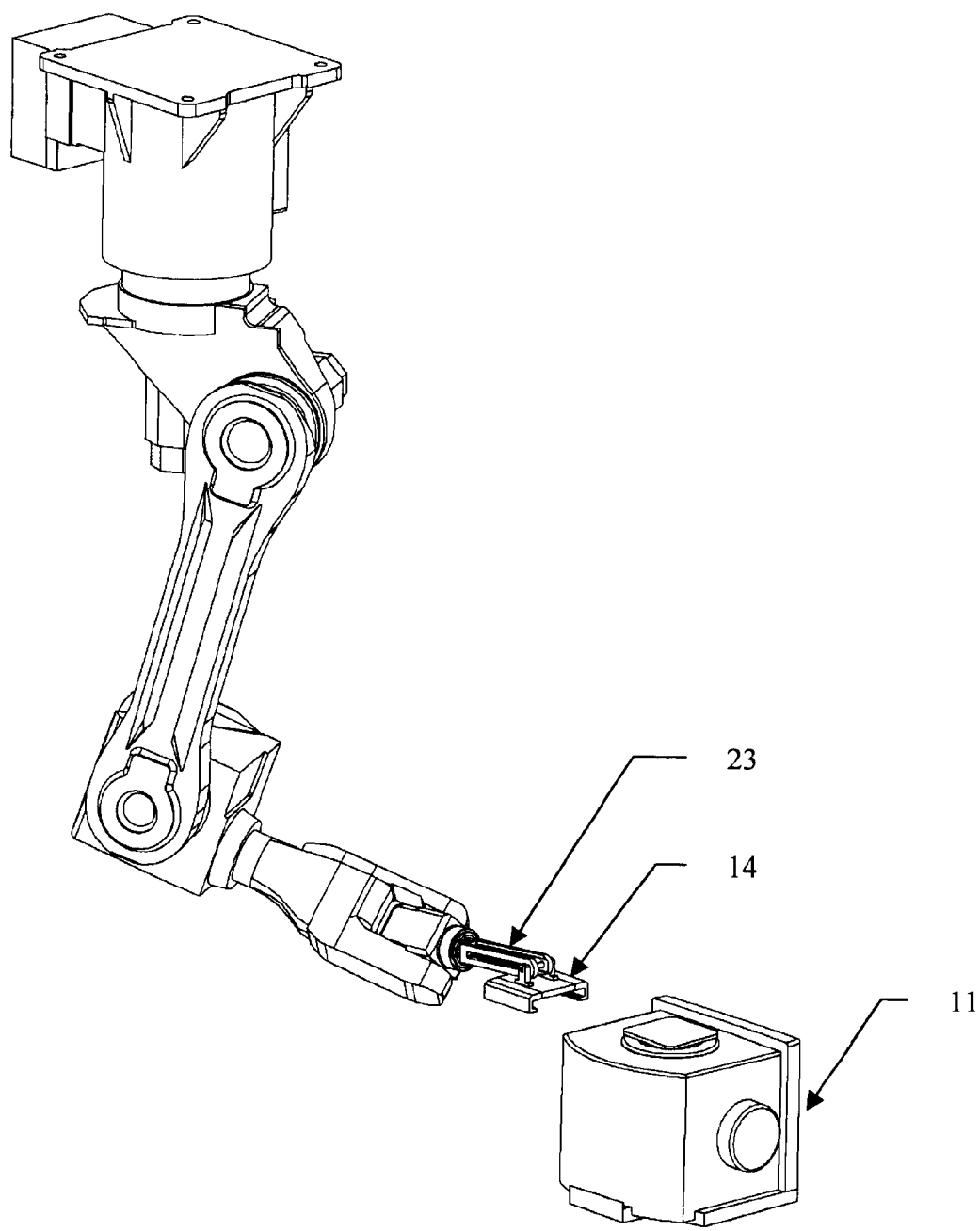
Figure 12:
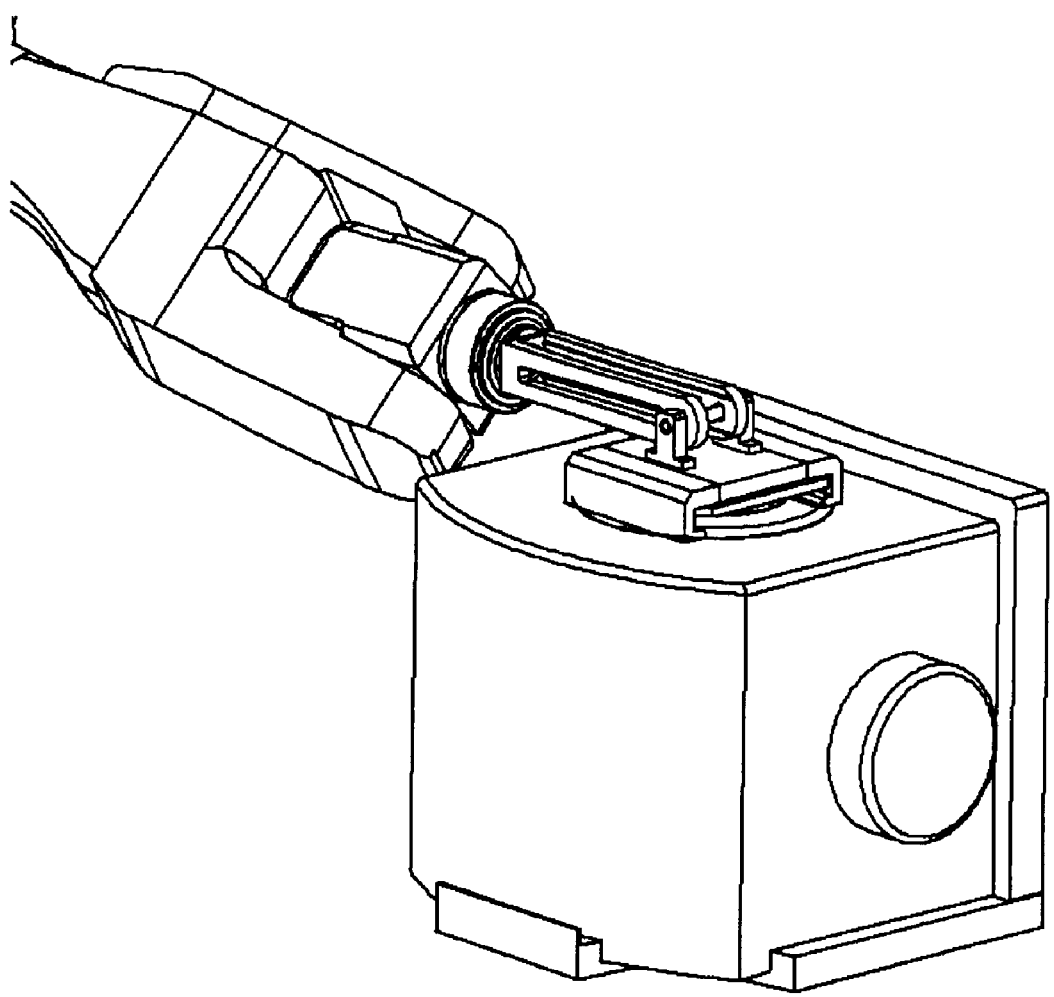

A shown in FIG. 8, a robot 12 has a multi-segment arm 13 movable within a plurality of degrees of freedom. An attachment arm 23 connects to an end effector 14 and is positionable by the robot to grasp objects.

The robot 12 is preferably an articulated arm robot, for example commercially available from Samsung Electronics, Kawasaki Robots, or Fanuc Robotics. Fanuc Robotics model M-6iB is a suitable robot. The robot 10 has an arm 13 that is movable within six degrees of freedom (DOF). The robot 12 includes a base 22 configured to rotate within a horizontal plane (first DOF). The robotic arm 13 further includes an upper arm 26 having an upper end 26a pivotably attached (second DOF) to the shoulder 24 by means of a laterally extending shaft and servo motor 25. The arm 13 also includes a "forearm" 28 having a first end 28a pivotably attached (third DOF) to the free end 26b of the upper arm 26 by means of a pivot shaft 27. The forearm 28 is pivoted about shaft 27 by movement of actuator arm 29 pivotably connected at end 29a to forearm 28 and at end 29b to shoulder 24. Further, a "wrist" 30 of the arm 13 is attached to the free end 28b of the forearm 28 and is capable of moving in the following three manners: by pivoting about the free end 28b of the forearm 28 (fourth DOF), by "spinning" about an axis 31 extending along the centerline of the forearm 28 (fifth DOF), and by spinning about the axis 31 (sixth DOF).

A robotic system is described in Soska, U.S. Pat. No. 6,369,353 entitled "Robotic laser tire mold cleaning system and method of use, incorporated herein by reference". This reference discloses details of the operation of robot motion.

Robotic arm 13 includes an end effector 14 mounted to the wrist 30. An end effector is the working tool that is positionable by movement of the robotic arm 13 within one or more of the degrees of freedom.

The forgoing describes one approach to constructing and operating a robot. The robot can be constructed in other ways known within the field of robotics to achieve the movement needed for moving objects in the buffer system.

Figure 7:
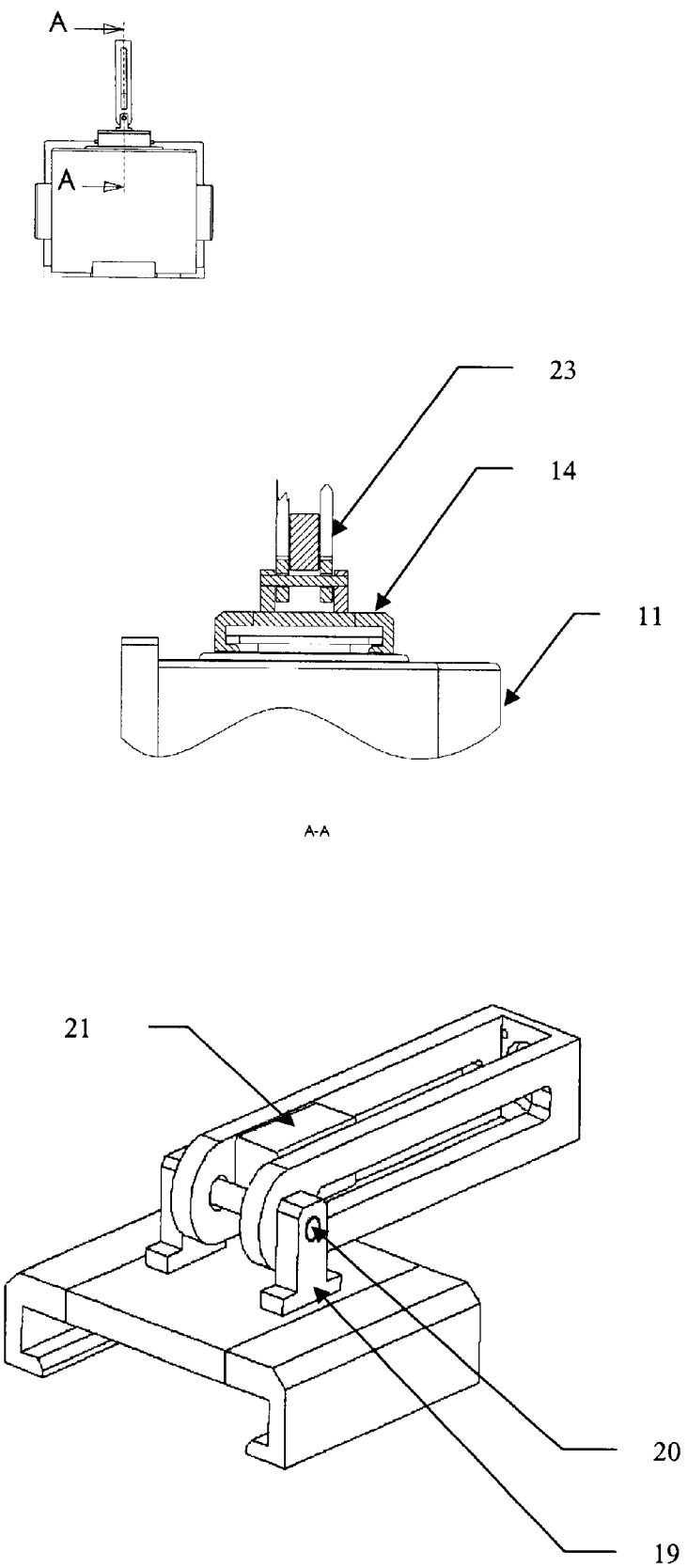
FIG. 7 is an enlarged isometric view of the end effector detailing product capture and oscillation dampening features.

As shown in FIG. 7 a standard pneumatic gripper 21 is mounted above the clasping end 19 around the pivot axis shaft 20 and when actuated, closes on shaft increasing friction, thereby dampening oscillation of the pivot axis 20.

The robot 12 includes a plurality of electric servomotors actuating and controlling the movement of the base 22 and the various portions of the arm 13 described above. However, any other appropriate means for actuating the movements of the components of the robot 12, such as for example, hydraulic or pneumatic motors can be utilized.

The robot 12 can be constructed in any other manner that enables the robotic storage/buffering system 10 to function as described in detail below. For example, the robot 12 can alternatively have a wrist 30 that is configured to spin, to rotate within a vertical plane, and to rotate in horizontal plane as opposed to spinning along axis 31. Further, the robot 12 may optionally include a machine vision system provided by, for example, video cameras connected to a video processor, so that the robot 12 can recognize the location of the end effector and adjust its position to ensure that the storage/buffering system 10 performs as desired during a load or unload operation, as described below.

FIGS. 8 through 12 show robot 12 in various stages of movement to capture a FOUP. FOUP 11 shown is representative of any object the robot captures.

Figure 13:
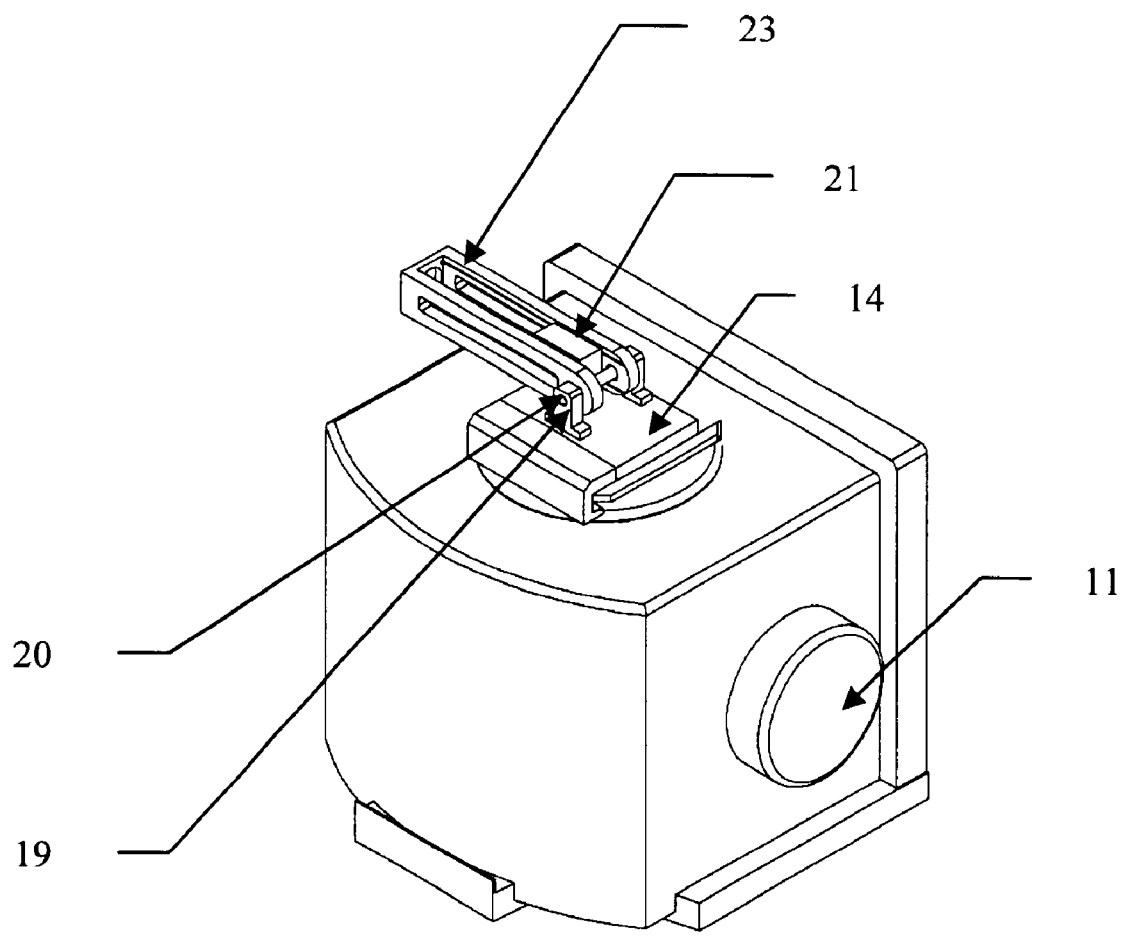
FIGS. 13–15 is a series of images demonstrating the pivot axis on the end effector, showing the end-effector attachment arm in the horizontal, 90 degree and 180 degree position respectively.
Figure 14:
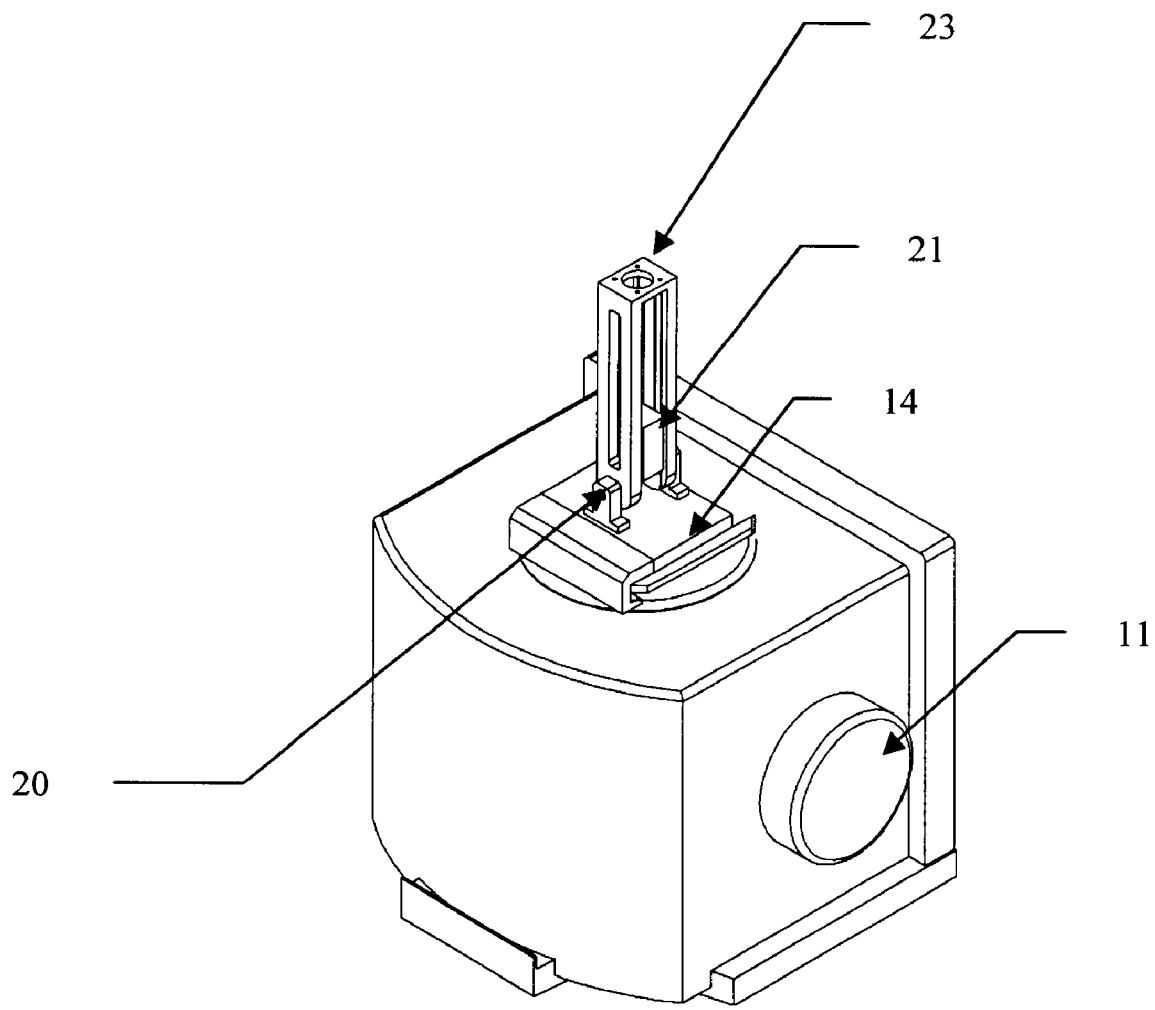
Figure 15:
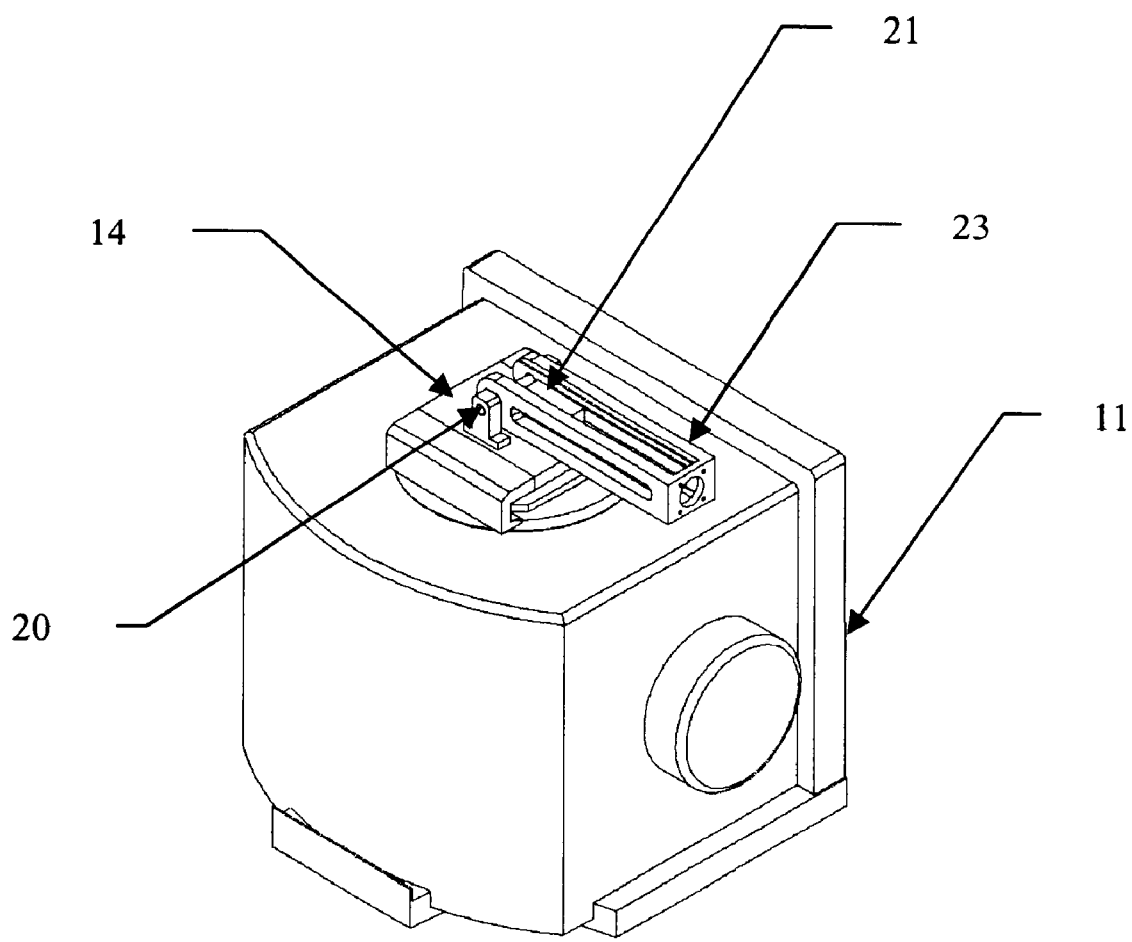

Referring to FIG. 13, the end effector 14 includes a clasping end 19, an attachment arm 23, a pivot axis 20, and a pneumatic gripper 21. The clasping end 19 is the mechanism whereby product is captured for transfer. The clasping end can be either a passive or active grip system depending on the substrate and/or substrate carriers 11 used. In this case a passive system is implemented to secure 300 mm Front Opening Unified Pods (FOUPs) that are used in transferring wafers during semiconductor processing. In FIGS. 13–15, the pivot axis 20 allows further range of motion when mounted on robot.

Controller 16 is used for controlling the operation of the robot 12 and end effector 14. During a load or unload operation, the controller 16 directs the robotic arm 13 so that the end effector 14 is moved through at least one predetermined set of movements with respect to substrate and/or substrate carrier 11. The predetermined set of movements causes the end effector 14 to actively or passively clasp the substrate or substrate carrier 11. The controller 16 also controls the activation and deactivation of the end effector 14 if an active one is used so that the end effector 14 clasping mechanism 19 is turned on and off at appropriate times during the load or unload operation. Further, the controller 16 is fully programmable so as to be capable of actuating the robotic arm 13 to move through a plurality of different predetermined sets of movements. Such controller programmability allows the storage/buffering system 10 to be used with various substrates 11 having different sizes and/or shapes. The controller 16 is preferably the standard control system provided with the commercially available robot 12, although the controller 16 can alternatively be a separately provided personal computer, a programmable logic controller ("PLC") or any other suitable programmable device connected with the robot 12 and with the end effecter 14.

When in operation, product is transferred in and out of the system via a plurality of I/O load ports 17 where product is presented to and from the environment external to the robot. The I/O load ports 17 can be either standard commercially available systems, or in specific situations a custom version can be designed for the application. In the internal robot environment, a plurality of storage locations 18 are configured in an optimal manner for storage of substrate and/or substrate carriers 11 during process. These locations are equipped with product presence/absence sensors for verification.

The robot utilizes an automatic teaching sequence to map the work cell environment to avoid collisions when loading and unloading product as well as sensing product orientation so that the robot can properly pick up the product even if it is misaligned. The auto teach algorithm software is a commercially available software package, such as Cell Finder from Fanuc, which resides in the robot controller that is also a standard and commercially available item, such as model RJ3 from Fanuc. The software algorithm utilizes the robots motors for sensing torque. Analyzing the torque curve, the software detects any spikes in the torque curve, which results from increased output from the motor due to an opposing force that would result from a collision. The training sequence requires the robot to approach a plurality of operator defined points.

Figure 16:
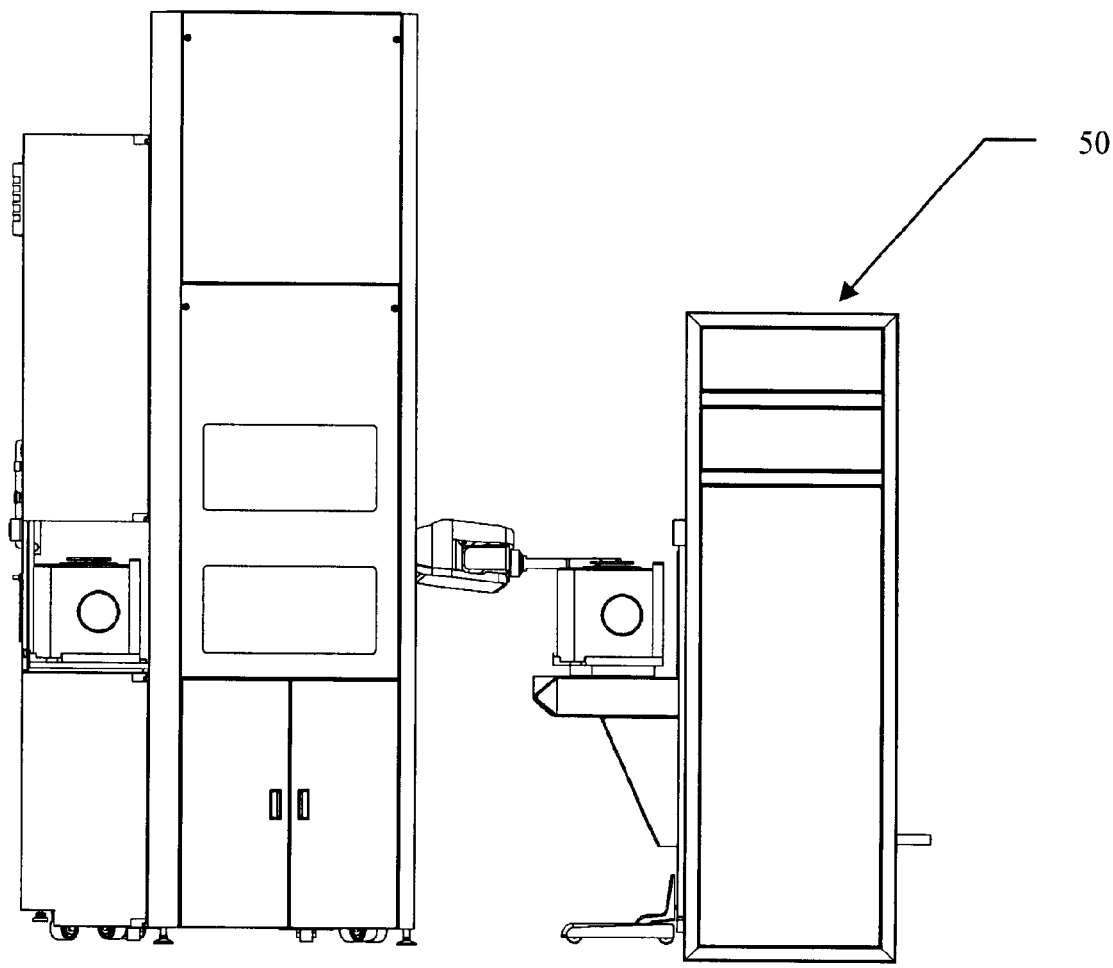
FIG. 16 shows the present invention robotic stocking system interface to a front end automation and process tool.

FIG. 16 shows the robotic stocking system interface to a process tool or front end automation system 50. An object, a FOUP in the figure, exits the stocking system through an opening in the rear of the storage enclosure. The object is passed to the load port of another system which will use the object.

ELEMENTS AND REFERENCE NUMBERS

10 Storage Buffering System
11 Substrate/Substrate Carriers
12 6-axis Robot, Fanuc m6IB clean room class 100, w/motor covers
13 Robot Arm
14 End-Effector
15 Removable Service Robot Cart
16 Fanuc, Robot Controller
17 I/O Load Ports
18 Storage Location
20 Pivot Axis (End-Effector)
21 Pneumatic Gripper (End-Effector)
22 Robot Base
23 Attachment Arm (End-Effector)
24 Shoulder
25 Servo motor
26 Upper Arm
27 Pivot Shaft
28 Forearm
29 Actuator Arm
30 Wrist
31 Forearm centerline Axis
33 Casters, Removable Service Robot Cart
34 Kinematic Coupling, Removable Service Robot Cart
35 FOUP Shelf
36 Pneumatic Actuator, Magnetically couple
37 Fanuc, OP box Type-B, CE Mark
38 Sensor, Front sensing, convergent reflective
39 Kinematic Pin
40 Storage enclosure
42 Sliding door
43 Access door
50 Process tool or front-end automation

What is claimed is:

1. A storage system for the stocking of objects in a process environment comprising:

a storage enclosure for storing objects comprising a plurality of storage shelves, each shelf having at least one storage location;

a removable service cart to engage with the storage enclosure;

a multi-axis robot mounted to the removable service cart in an inverted orientation;

an end effector connected to the robot suitable for grasping the objects;

at least one load port; and a controller for controlling the robot movement;

whereby the robot transfers objects between the load port and the storage locations under control of the controller.

2. The storage system of claim 1 wherein each storage shelf further comprises a sensor to detect the presence or absence of an object.

3. The storage system of claim 1 further comprising a process station for performing a process on the stored objects.

4. The storage system of claim 1 wherein the end effector has one additional degree of freedom.

5. The storage system of claim 1 wherein the controller executes a teaching sequence to map the location of features within the storage enclosure.

6. A storage system for the stocking of substrate carrier pods in a process environment comprising:

a storage enclosure for storing objects comprising a plurality of storage shelves, each shelf having at least one storage location and a sensor to detect the presence or absence of an object;

a removable service cart to engage with the storage enclosure;

a multi-axis robot mounted to the removable service cart in an inverted orientation;

an end effector suitable for grasping the objects connected to the robot and having at least one axis of motion;

at least one load port; and a controller for controlling the robot movement;

whereby the robot transfers objects between the load port and the storage locations under control of the controller.

7. The storage system of claim 6 further comprising a process station for performing a process on the substrate carrier pods.

8. The storage system of claim 6 further comprising a sliding door with a first position substantially covering the load port and a second position allowing access to the load port.

* * * * *